United States Patent
Wong et al.

(10) Patent No.: US 6,815,362 B1
(45) Date of Patent: Nov. 9, 2004

(54) END POINT DETERMINATION OF PROCESS RESIDUES IN WAFER-LESS AUTO CLEAN PROCESS USING OPTICAL EMISSION SPECTROSCOPY

(75) Inventors: Vincent Wong, Pleasanton, CA (US); Brett C. Richardson, San Ramon, CA (US); Andrew Lui, Fremont, CA (US); Scott Baldwin, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/138,980

(22) Filed: May 3, 2002

Related U.S. Application Data (60) Provisional application No. 60/288,678, filed on May 4, 2001.

(51) Int. Cl.[7] .............................................. H01L 21/302
(52) U.S. Cl. ........................... 438/706; 438/8; 438/710; 438/712; 134/1.1
(58) Field of Search ............................. 438/706, 710, 438/712, 7, 8, 9; 498/9; 156/345; 134/1.1, 1.2

(56) References Cited

U.S. PATENT DOCUMENTS

| | | | |
|---|---|---|---|
| 5,361,201 A | | 11/1994 | Jost et al. |
| 5,414,621 A | | 5/1995 | Hough |
| 5,680,305 A | | 10/1997 | Apgar, IV |
| 5,857,174 A | | 1/1999 | Dugan |
| 6,115,694 A | | 9/2000 | Cheetham et al. |
| 6,141,648 A | | 10/2000 | Bonissone et al. |
| 6,178,406 B1 | | 1/2001 | Cheetham et al. |
| 6,200,412 B1 | * | 3/2001 | Kilgore et al. .......... 156/345.28 |
| 6,221,169 B1 | * | 4/2001 | Bernstein et al. .............. 134/2 |
| 6,228,775 B1 | * | 5/2001 | Coburn et al. .............. 438/714 |
| 6,633,391 B1 | * | 10/2003 | Oluseyi et al. .............. 356/630 |

* cited by examiner

*Primary Examiner*—Lan Vinh
(74) *Attorney, Agent, or Firm*—Martine & Penilla, LLP

(57) ABSTRACT

A method for determining an endpoint of an in-situ cleaning process of a semiconductor processing chamber is provided. The method initiates with providing an optical emission spectrometer (OES) configured to monitor selected wavelength signals. Then, baseline OES threshold signal intensities are determined for each of the selected wavelength signals. Next, an endpoint time of each step of the in-situ cleaning process is determined. Determining an endpoint time includes executing a process recipe to process a semiconductor substrate within the processing chamber. Executing the in-situ cleaning process and recording the endpoint time for each step of the in-situ cleaning process are also included in determining the endpoint time. Then, nominal operating times are established for each step of the in-situ cleaning process. A plasma processing system for executing a two step in-situ cleaning process is also provided.

15 Claims, 10 Drawing Sheets

END POINT DETERMINATION OF PROCESS RESIDUES IN WAFER-LESS AUTO CLEAN PROCESS USING OPTICAL EMISSION SPECTROSCOPY

CROSS REFERENCE TO RELATED APPLICATIONS

This application claims priority from U.S. Provisional Patent Application No. 60/288,677 filed May 4, 2001 and entitled "Endpoint Determination of Process Residues in Wafer-less Auto Clean Process Using Optical Emission Spectroscopy." This provisional application is herein incorporated by reference. This application is related to (1) U.S. patent application Ser. No. 10/138,980, filed on May 3, 2002, and entitled "Plasma Cleaning of Deposition Chamber Residues Using DuoStep Wafer-less Auto Clean Method," (2) U.S. patent application Ser. No. 10/138,288, filed May 2, 2002, and entitled "High Pressure Wafer-less Auto Clean for Etch Applications," These applications are hereby incorporated by reference.

FIELD OF THE INVETION

This invention generally relates to an apparatus and method of cleaning a processing chamber to remove previously deposited chamber residues, which have accumulated on interior surfaces of the apparatus. In particular, the invention relates to endpoint determination of wafer-less plasma cleaning methods for the substantial elimination of residues on interior walls, or other components inside the processing chamber.

BACKGROUND OF THE INVENTION

The continuing trend for smaller geometries for semiconductor devices makes it more difficult to maintain the uniformity and accuracy of critical dimensions. Moreover, it has become increasingly important that the environment inside the processing chamber be clean and consistent to ensure acceptable wafer to wafer variability of the critical dimensions. As is known in the art, many of the processes carried out within the semiconductor processing chambers leave deposits on the inner surfaces of the processing chamber. As these deposits accumulate over time, they can become a source of particulate contamination that is harmful to the substrates being processed should the particulate contamination flake off and fall onto the surface of the substrate.

In addition, the build up of deposits on the inner surfaces of the chamber causes an inconsistent chamber conditioning environment which impacts the processing operation being performed. That is, the build up of deposits increases with each processing operation. Thus, each successive processing operation does not initiate with the same chamber conditions. Accordingly, the change in starting conditions for each successive processing operation causes a variance that eventually exceeds acceptable limits, which results in etch rate drift, critical dimension drift, profile drift, etc.

One attempt to solve these issues has been to run cleaning processes in between processing operations. However, as these cleaning processes do not have an automated endpoint determination associated with the cleaning process, the cleaning process is run for a specified time. Running the cleaning process in time mode results in a significantly longer run time than necessary to ensure the processing chamber is clean, rather than risk the chamber being under-cleaned. This over-clean mode may result in chamber part degradation which in turn decreases lifetime of the parts and increases the cost of consumables.

Figure 1:
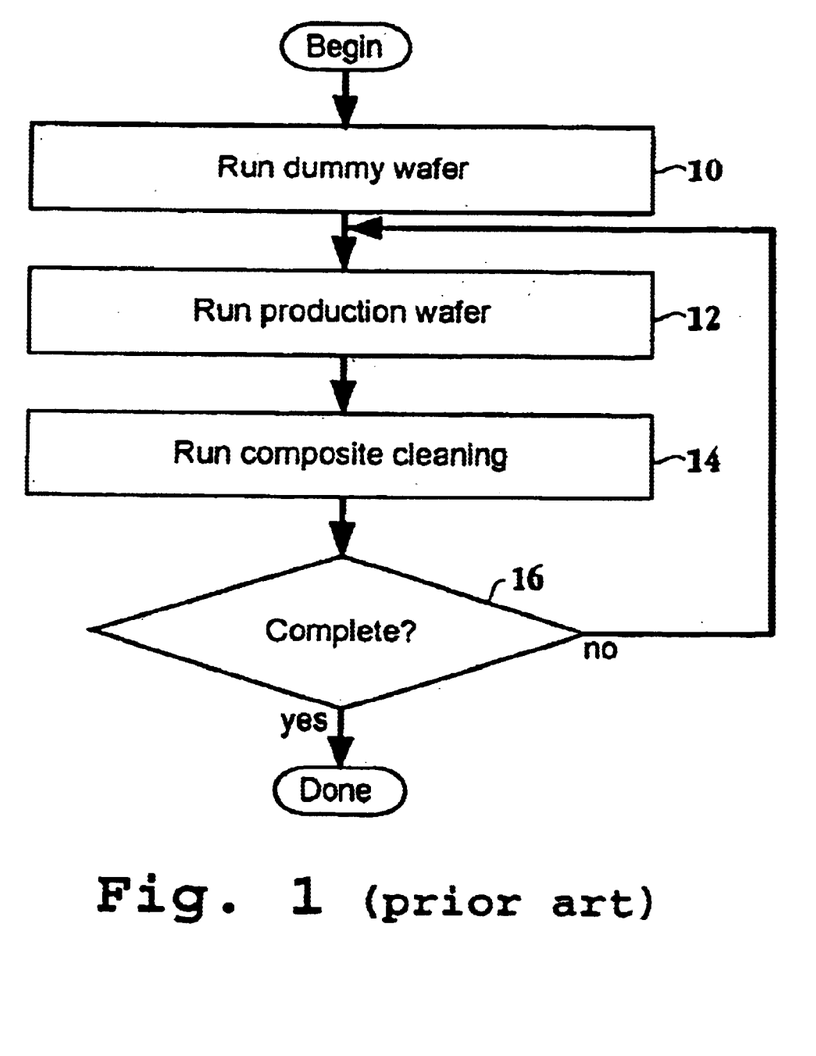
FIG. 1 is a flowchart diagram of the method operations for a composite one step cleaning process for the removal of all chamber deposition byproducts based on a time mode.

FIG. 1 is a flowchart diagram of the method operations for a composite one step cleaning process for the removal of all chamber deposition byproducts based on time mode operation. The method initiates with operation 10 where dummy wafers are processed to check for process readiness. The method then advances to operation 12 where production wafers are processed. Then, the method moves to operation 14 where the etchants for both silicon based byproduct removal and carbon based byproduct removal are combined to run a single step cleaning operation. The single step cleaning operation is run for a predetermined time period. If there are more wafers to be processed, the production wafers are rerun through operations 12 and 14. The method operations of FIG. 1 can also be performed in wafer-less conditions, in which case it is considered a one-step (composite) wafer-less auto clean (WAC) process.

Another shortcoming of running the cleaning process in time mode is the inapplicability of a single time mode, i.e., predetermined time period, to mix-application products with different film stacks, including different film thickness and materials, such as Polygate and Shallow Trench Isolation (STI) operations. The different applications have different byproduct deposition levels. Thus, running the cleaning method in time mode may be effective for cleaning the chamber between Polygate processes but not STI processes. Moreover, the cleaning method may be effective for one byproduct of the polygate process, but not effective for other byproducts. In addition, the cleaning processes previously have attempted to remove all deposited byproducts with a one step cleaning process. Therefore, the use of traditional optical endpoint detection methods have not been successful because it is unclear as to which wavelengths to monitor to determine an endpoint. For example, the single or dual monochromators used in the prior art are limited in the available wavelengths appropriate for use in both processing wafers and in-situ cleaning processes.

In view of the foregoing, what is needed is a method and apparatus for monitoring the cleaning effectiveness for a cleaning process based upon real time data to determine an endpoint in order to avoid under-cleaning and over-cleaning conditions.

SUMMARY OF THE INVENTION

The present invention provides a method and apparatus configured to determine an endpoint for a cleaning process for removing silicon and carbon based deposition byproducts using a two-step cleaning process where each step of the cleaning process is optimized for removing a byproduct. In one embodiment, the first step of the two-step cleaning process is optimized for removing silicon-based chamber byproducts and the OES wavelength integration bands associated with the products and reactants from the first step are monitored to determine an endpoint. The second step of the two-step cleaning process is optimized for the removal of carbon-based deposition byproducts and the OES wavelength integration bands associated with the products and reactants from the second step are monitored to determine an endpoint. It should be appreciated that the present invention can be implemented in numerous ways, including as an apparatus, a system, a device, or a method. Several inventive embodiments of the present invention are described below.

In one embodiment, a method for determining an endpoint of an in-situ cleaning process of a semiconductor processing chamber is provided. The method initiates with providing an optical emission spectrometer (OES) configured to monitor selected wavelength signals. Then, baseline OES threshold signal intensities are determined for each of the selected wavelength signals. Next, an endpoint time of each step of the in-situ cleaning process is determined. Determining an endpoint time includes executing a process recipe to process a semiconductor substrate within the processing chamber. Executing the in-situ cleaning process and recording the endpoint time for each step of the in-situ cleaning process are also included in determining the endpoint time. Then, nominal operating times are established for each step of the in-situ cleaning process.

In another embodiment of the present invention, a method for cleaning byproducts deposited on interior surfaces of a semiconductor processing chamber is provided. The method initiates with flowing an etchant process gas with a fluorine-containing compound of the formula $X_yF_z$, the fluorine-containing compound being optimized to remove silicon and silicon compounds. Then, a first plasma is formed from the etchant process gas to perform a silicon based cleaning step. Next, an emission intensity of an optical radiation from a reactant or a product in the first plasma is detected. Then, the silicon based cleaning step is ended after the emission intensity reaches a threshold value and when a slope of a trace of the emission intensity is about zero.

In yet another embodiment, a method for cleaning interior surfaces of a processing chamber is provided. The method initiates with flowing an etchant process gas with an oxygen-containing compound, the oxygen-containing compound being optimized to remove carbon and carbon compounds. Then, a first plasma is formed from the etchant process gas to perform a carbon based cleaning step. Next, an emission intensity of an optical radiation is detected from one of a reactant or a product in the first plasma. Then, the carbon based cleaning step is ended when a slope of a trace of the emission intensity is about zero after the emission intensity reaches a threshold value.

In still yet another embodiment of the invention, a plasma processing system for executing a two step in-situ cleaning process is provided. The plasma processing system includes a processing chamber having a gas inlet for introducing a cleaning gas. The cleaning gas is optimized to remove byproducts deposited on inner surfaces of the processing chamber. The processing chamber includes a top electrode for creating a plasma from the cleaning gas to perform an in-situ cleaning process. A variable conductance meter for controlling a pressure inside the processing chamber independently of a flow rate of process gases is included. The variable conductance meter is positioned on a outlet of the processing chamber. An optical emission spectrometer (OES) for detecting an endpoint of the in-situ cleaning process performed in the processing chamber is included. The OES is located so as to detect an emission intensity in the processing chamber from the plasma and the OES is configured to trance the emission intensity from the plasma. A pumping system for evacuating the processing chamber between processing operations is also included.

Other aspects and advantages of the invention will become apparent from the following detailed description, taken in conjunction with the accompanying drawings, illustrating by way of example the principles of the invention.

BRIEF DESCRIPION OF DRAWINGS

The present invention will be readily understood by the following detailed description in conjunction with the accompanying drawings, with like reference numerals designating like elements.

DETAILED DESCRIPTION OF THE PREFERRED EMBODIMENTS

An invention is described for providing an endpoint determination for an optimized dual step wafer-less auto clean method optimized for removing multiple byproducts deposited onto walls of a semiconductor processing chamber. It will be obvious, however, to one skilled in the art, that the present invention may be practiced without some or all of these specific details. In other instances, well known process operations have not been described in detail in order not to obscure the present invention.

Optical emission spectroscopy (OES) relies on the changes in the emission intensity of characteristic optical radiation from either a reactant or product in a plasma As is known, light is emitted by excited atoms or molecules in a plasma when electrons relax from one energy state to another. The atoms or molecules emit a series of spectral lines unique to each species and the emission intensity is a function of the relative concentration of the species.

The embodiments of the invention discussed below include an apparatus and method to use OES for monitoring the effectiveness of a wafer-less auto clean (WAC) also referred to as a chamber in-situ plasma clean. The appropriate times for running a WAC without experiencing over-cleaning or under-cleaning can be determined with the use of an OES. Additionally, a signal from an OES monitor can be used to automatically trigger the endpoint of the WAC through software coding of the methods described below. It should be appreciated that while the embodiments are described with respect to a WAC process, any suitable cleaning process can be monitored with the embodiments included herein.

In plasma etching processes, an RF diode configuration is normally used to establish the glow discharge. The glow discharge is used primarily as a source of energetic ions, which are used to bombard target surfaces and cause sputtering. That is, the glow discharge produces reactive species for chemically etching the surfaces of interest. In plasma etching systems high frequency 13.6 Mz RF diode configurations are primarily used. If a 13.6 MD frequency is used for the applied RF power, this frequency is high enough so that the ions require several RF cycles to traverse the dark space between the bulk plasma region and the wafer region.

Knowledge about the potential distribution in plasma etching systems is useful because the energy with which particles impinge on the etched surface depends on the potential distribution. In addition, plasma potential determines the energy with which ions strike other surfaces in the chamber, and high-energy bombardment of these surfaces can cause sputtering and consequent re-deposition of the sputtered material. Silicon-based residues are often formed on the interior surfaces of a processing operation, such as in deposition and etching operations involving silicon wafers. In addition, carbon based residues can also be formed on the interior surfaces when photoresist is eroded, where photoresist serves as the mask in the patterning of the semiconductor devices.

The two step wafer-less auto clean (WAC) of the present invention efficiently cleans these deposits and allows for a consistent baseline environment for the beginning of each etch operation. The two step WAC begins by forming a first plasma from process etchant gases introduced into the processing chamber. The first plasma is optimized to react with the silicon-based residues to form gases that may be removed from the chambers interior. Following the first plasma process, a second plasma is formed from process etchant gases introduced into the processing chamber. The second plasma is optimized to react with the carbon-based residues to form gases that may be removed from the chambers interior.

Because silicon residues are more prevalent in the chamber, the two step method can be configured to spend more time to ensure removal of the silicon based byproducts and less time so that the carbon based byproducts are removed without over-cleaning. Thus, the two step process will not have a significant impact on the throughput of the system as compared to the composite one step process. Additionally, the optimized two step process provides for a more uniform environment inside the processing chamber between each operation. Consequently, the repeatability of the etch operation from wafer to wafer is enhanced because of the consistent environment provided inside the processing chamber through the two step WAC technique. That is, the buildup of byproducts on the inner surfaces of the processing chamber, over time, is substantially eliminated allowing for stable/repeatable etch rates from wafer to wafer and extended mean time between cleaning (MTBC).

Figure 2:
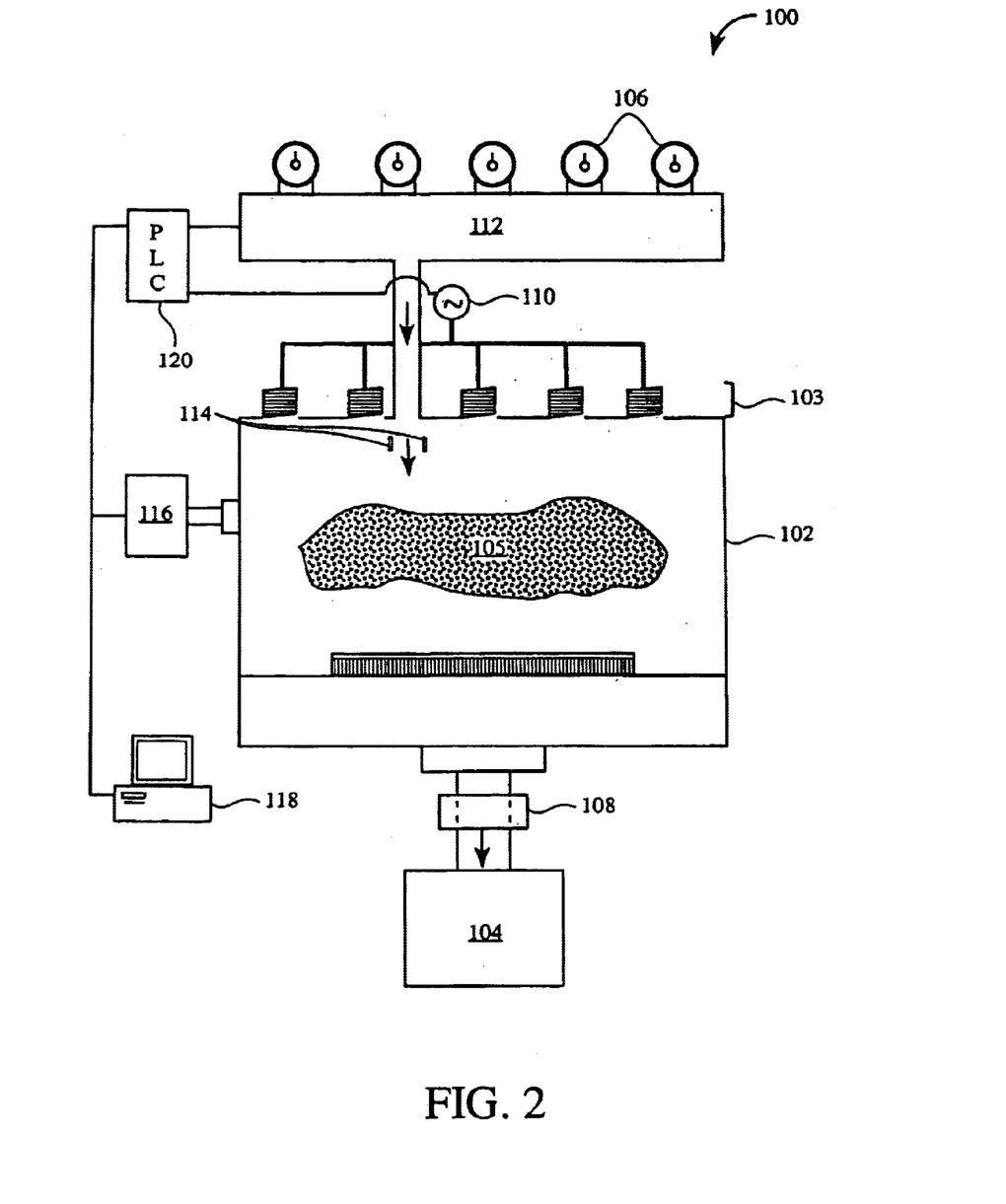
FIG. 2 is a simplified cross-sectional schematic diagram of a plasma etching system configured to execute a dual step cleaning process in accordance with one embodiment of the invention.

FIG. 2 is a simplified cross-sectional schematic diagram of a plasma etching system configured to execute a dual step cleaning process in accordance with one embodiment of the invention. Exemplary plasma etch systems include the 2300 Poly VERSYS® Wafer-less Auto Clean System, also referred to as PolyWAC, and the TCP 9400PTX, both owned by the assignee. Plasma etching system 100 consists of several components, such as etching chamber 102 that is evacuated to reduced pressure, a pumping system 104 for establishing and maintaining the reduced pressure, pressure gauges 106 to monitor pressure in the chamber, a variable conductance meter 108 between pumping system 104 and etching chamber 102 so that the pressure and flow rate in the etching chamber can be controlled independently. A radio frequency (RF) power supply 110 creates the glow discharge. Gas handler 112 meters and controls the flow of reactant gases. Electrodes 114 are used to strike a plasma and optical emission spectroscopy (OES) monitor 116 monitors wavelengths specific to etching chamber 102 deposition removal products and chamber deposition removal reactants. It should be appreciated that in the past plasma cleans were used for cleaning reactors with the wafer in the reactor chamber to cover the electrode, but it has become more common to do wafer-less plasma cleans. This has led to the use of a wafer-less auto clean (WAC). In one embodiment, the operations are computer controlled by computer 118 to automatically start the wafer-less plasma cleans at set wafer processing intervals. For example, the WAC process can be run after each wafer, after a lot of wafers or after some other suitable interval. In another embodiment, the process parameters discussed below are input as a recipe and the process parameters are controlled by a control system, such as a programmable logic controller (PLC) 120 that interfaces with the reaction chamber.

The WAC process has conventionally used a composite one-step recipe focused on the removal of all chamber deposition byproducts involving a mixture of etchant gases for the removal of both silicon based byproducts and carbon based byproducts. However, a composite WAC recipe for both silicon and carbon byproduct removal suffers from lower removal rates of both silicon and carbon-based deposition byproducts. In addition, aluminum fluoride compounds left behind in the one step recipe adversely impact later performed etch operations.

As is known in the art, silicon-based residues are often formed on the interior surfaces of a processing operation, such as in deposition and etching operations involving silicon wafers. Carbon based deposition products are also formed on the chamber during processing operations. In general, the percentage of silicon based byproducts to carbon based byproducts is not a 1:1 ratio, since silicon based byproducts are found in a greater amount than carbon based byproducts. It will be apparent to one skilled in the art that silicon based byproducts are the predominant chamber deposition species in Polysilicon Etch equipment. The present invention provides a method to clean the inner surfaces of semiconductor processing chamber by forming a plasma from process etchant gases specific and optimized to the byproduct to be removed. More particularly, the method is further optimized by enabling endpoint determination for each step of the cleaning process. That is, the cleaning process for the silicon based byproducts is optimized to efficiently remove silicone based byproducts, while the cleaning process for the carbon based byproducts is optimized to efficiently remove carbon based byproducts.

The endpoint for each of the above steps is determined by monitoring an integration band, i.e., width of OES spectra wavelengths, associated with chamber deposition removal products or chamber deposition removal reactants. In one embodiment, the targeted byproduct removal process is a two step process where the first step uses $SF_6$ chemistry, or other fluorine based chemistry, such as $NF_3$, to remove silicone based (inorganic) byproducts. The second step uses oxygen ($O_2$) based chemistry to remove carbon based (organic) byproducts from the chamber walls. The cleaning process is preferably performed after each wafer, however, any suitable cleaning frequency may be used. Additionally, the $O_2$ chemistry of the second step assists in the purging of any fluorine in order to substantially prevent the formation of aluminum fluoride compounds in the carbon clean step.

Figure 3:
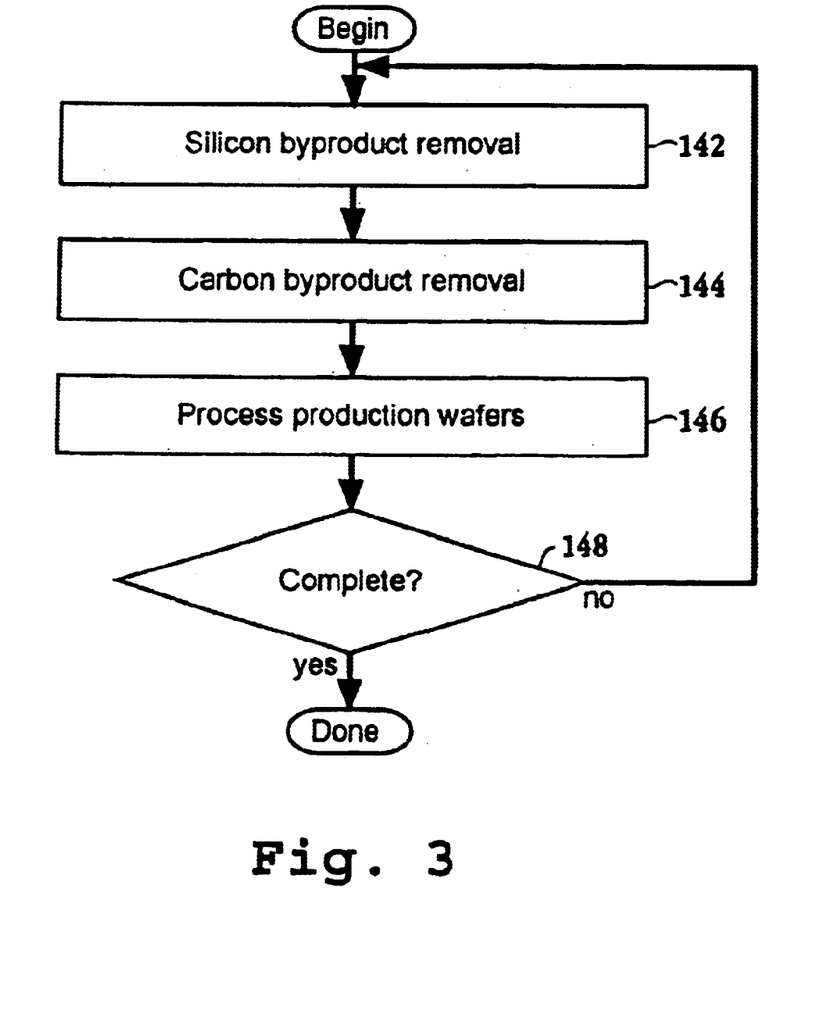
FIG. 3 is a flowchart diagram of the method operations performed for a dual step byproduct removal WAC technique in accordance with one embodiment of the invention.

FIG. 3 is a flowchart diagram of the method operations performed for a dual step byproduct removal WAC technique in accordance with one embodiment of the invention. The method initiates with operation 142 where silicon byproduct is removed. It should be appreciated that operation 142 can be performed following the processing of a wafer or multiple wafers or even following an initial gas stability operation. Here, a fluorine based etchant gas is introduced into the chamber and a plasma is struck. The fluorine based plasma removes the silicon based (inorganic) byproducts from the inner surfaces of the processing chamber. The method then moves to operation 144 where a carbon based (organic) byproduct is removed. Here, an oxygen based ($O_2$) based etchant gas is introduced into the chamber and a plasma is struck. It should be appreciated that the decoupling of the two process steps allows for each process to be optimized for the particular byproduct. As mentioned above, when silicon is the predominant chamber deposition species the time for each process step can be optimized. More specifically, the time for the silicon cleaning step can be lengthened while the time for the carbon cleaning step can be shortened. Thus, the cleaning time does not substantially increase from the cleaning time for the composite WAC process. It should be appreciated that the operations can be performed for a specified amount of time or the cleaning operations can be controlled through software detection of an endpoint.

The method then advances to operation 146 where the production wafers are processed in the chamber. As mentioned above, multiple wafers may be processed ire between cleaning operations or a single wafer may be processed in between cleaning operations. The processing performed on the production wafers could be any etch or deposition process, such as Polygate, shallow trench isolation (STI) applications and other suitable semiconductor processing operations that can deposit material on the inner surfaces of the processing chamber. The method then proceeds to decision operation 148 where it is determined if the processing for the wafer is completed. If the processing is not complete, then the method returns to operation 142. The process is repeated until all the wafers have been completed. If it is determined that the processing is complete then the method terminates.

Figure 4:
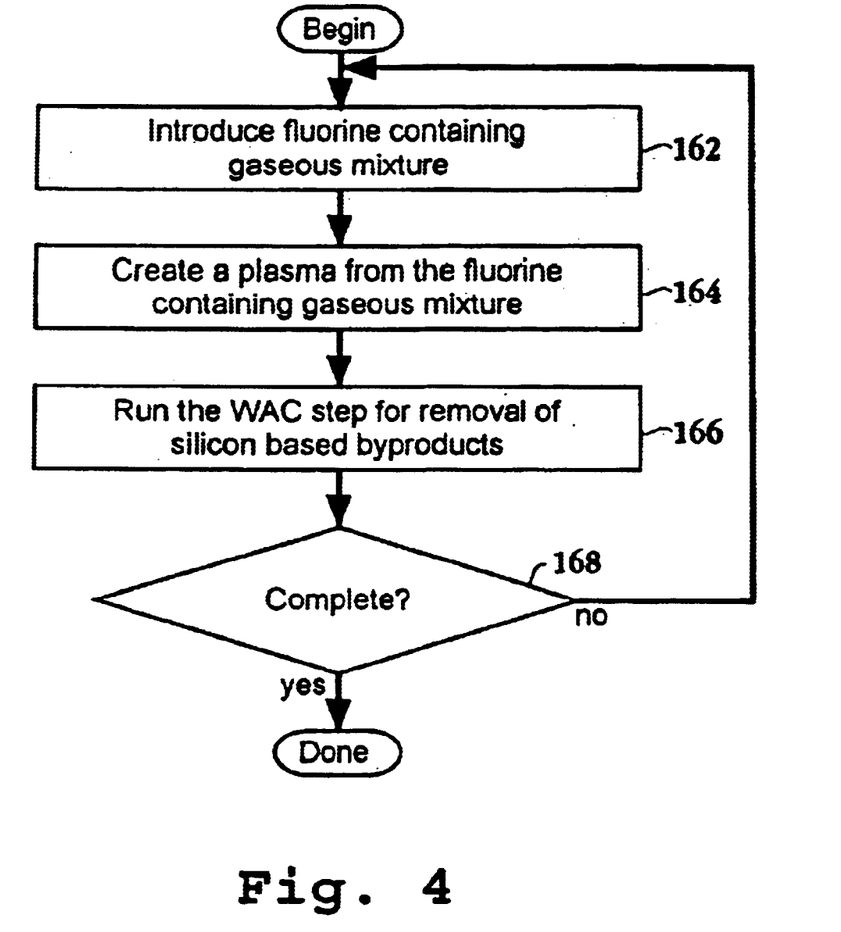
FIG. 4 is a more detailed flowchart diagram of the method operation of removal of silicon byproduct of FIG. 3.

FIG. 4 is a more detailed flowchart diagram of the method operation of removal of silicon byproduct of FIG. 3. The method initiates with operation 162 where a fluorine containing gaseous mixture is introduced into a processing chamber. A suitable processing chamber is the chamber described with reference to FIG. 2. Fluorine is used as an etchant for the removal of silicon based compounds. In one embodiment, the fluorine etchant is a gaseous composition that includes at least about 75% of a fluorine-containing compound of the formula $X_yF_z$, and is introduced into a reaction chamber configured to support a wafer-less auto clean (WAC) process, such as the processing chamber of FIG. 2. The recipe for removing the silicon byproduct with the fluorine etchant is optimized for process parameters such as: temperature, pressure, reactant gas flow rate, transformer coupled plasma power and bias voltage for maximum removal of silicon and silicon based compounds from interior surfaces of the processing chamber. Table I below provides process operating ranges for process parameters in accordance with one embodiment of the invention. It should be appreciated that the provided ranges may vary with the different configurations of processing chamber. Furthermore, the ranges of Table I are optimal ranges for a plasma etch system, such as the 2300 Poly Wafer-less Auto Clean System or TCP 9400 PTX etch system. As shown below, the flow rate of the fluorine containing gaseous mixture, i.e., $SF_6$, of operation 162 can range from about 50 standard cubic centimeters per minute (sccm) to about 400 sccm in one embodiment of the invention.

A preferred range for the flow rate is between about 50 sccm and about 100 sccm.

TABLE 1

| Parameter | Optimal Range | Mid Range | Wide Range |
|---|---|---|---|
| Pressure | 3 mT | 2–5 mT | <100 mT |
| TCP Power | 1000 W | 800–1000 W | 800–1500 W |
| $SF_6$ Flow | 50 sccm | 50-100 sccm | 50–400 sccm |

The method then advances to operation 164 where a plasma is created from the fluorine containing gaseous mixture. The processing parameters are provided with reference to Table 1. In particular, the pressure can range between about 0 milliTorr (mT) and about 1OOmT, with a preferred range of between about 2 mT and about 5 mT. The transformer coupled plasma (TCP) power is between about 800 watts (W) and about 1500 W, with a preferred range of between about 800 W and about 1000 W. One skilled in the art will appreciate that the processing chamber may be configured as a capacitively coupled chamber or an inductively coupled chamber. For a capacitively coupled chamber the bottom power would preferably be set to 0. Additionally, the fluorine containing gas can include a mixture of $SF_6$ and $NF_3$. In one embodiment, the mixture is a 1:1 ratio of the $SF_6$ and $NF_3$ gases. Alternatively, the $NF_3$ can replace the $SF_6$. In another embodiment, the gas mixture may contain a small percentage of $O_2$ to assist in breaking up any fluorine. Here, the $O_2$ flow rate would be between about 0% and about 10% of the $SF_6$ or $NF_3$ flow rate. Preferably, there is no $O_2$ flow rate.

The method of FIG. 4 then proceeds to operation 166 where the WAC step for removal of silicon based byproducts is performed. Here, the silicon clean step, as explained above, is executed with the process parameters set as described above with reference to Table 1. The method then advances to decision operation 168 where it is determined if the silicon byproduct has been removed. In one embodiment, the endpoint is determined by optical emission spectroscopy (OES), such as through OES monitor 116 with reference to FIG. 2.

Figure 5:
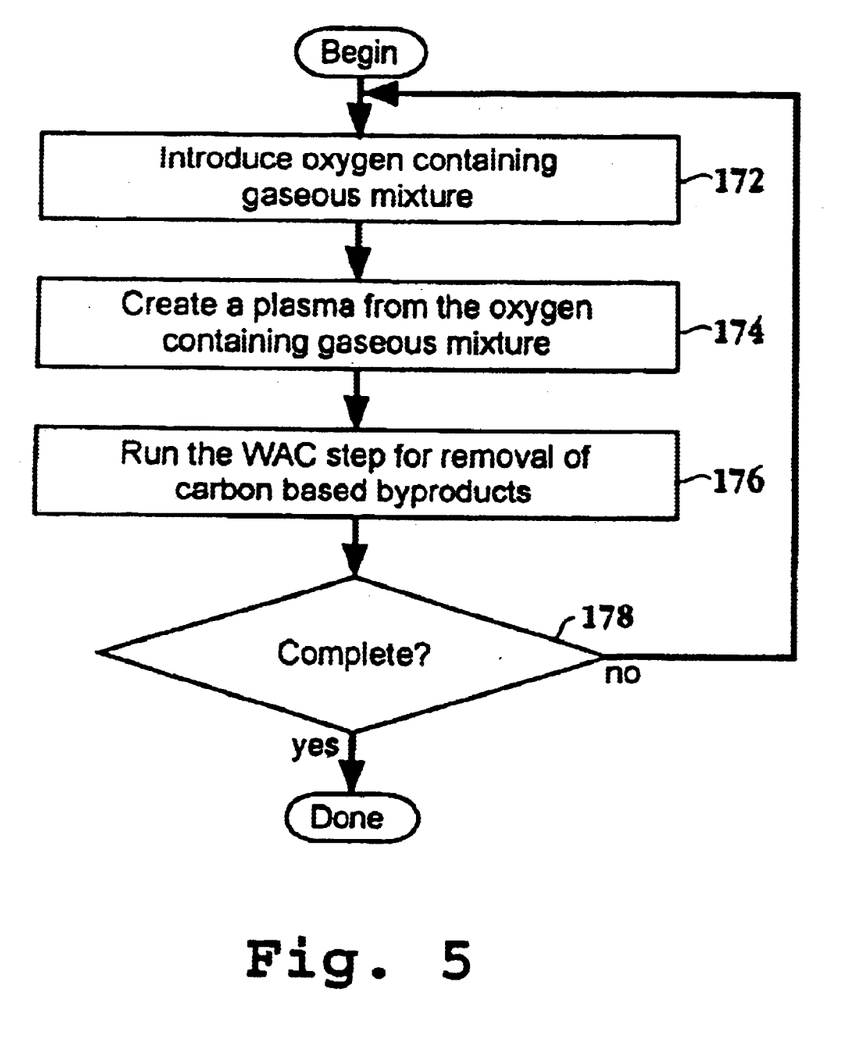
FIG. 5 is a more detailed flowchart diagram of the method operation of removal of carbon byproducts of FIG. 3.

FIG. 5 is a more detailed flowchart diagram of the method operation of removal of carbon byproducts of FIG. 3. The method initiates with operation 172 where an oxygen ($O_2$) containing gaseous mixture is introduced to a semiconductor processing chamber. It should be appreciated that the $O_2$ flow may or may not contain a small percentage of a fluorine containing gas, such as the fluorine containing gas etchants mentioned above with reference to FIG. 4. The recipe for removing the carbon byproduct with the oxygen etchant is optimized for process parameters such as: temperature, pressure, reactant gas flow rate, TCP power and bias voltage for maximum removal of carbon and carbon based compounds from interior surfaces of the processing chamber. Table 2 below provides process operating ranges for process parameters for a carbon clean where a small amount of a fluorine containing gas is optional in accordance with one embodiment of the invention. It should be appreciated that the provided ranges may vary with the different configurations of the processing chamber. Furthermore, the ranges of Table 2 are optimal ranges for a plasma etch system, such as the 2300 Versys Poly Wafer-less Auto Clean System. As shown below, the flow rate of the oxygen containing gaseous mixture of operation 172 can range from about 100 standard cubic centimeters per minute (sccm) to about 600 sccm with a preferred oxygen flow rate of about 100 sccm.

TABLE 2

| Parameter | Optimal Range | Mid Range | Wide Range |
| --- | --- | --- | --- |
| Pressure | 10 mT | 10–40 mT | <100 mT |
| TCP Power | 1000 W | 800–1000 W | 800–1500 W |
| $O_2$ Flow | 100 sccm | 100–500 sccm | 100–600 sccm |
| $SF_6$ Flow (10% $O_2$ Flow Max) | 10 sccm | (0–10% $O_2$ Flow Max) | (0–10% $O_2$ Flow Max) |

The method of FIG. 5 then advances to operation 174 where a plasma is created from the oxygen containing gaseous mixture. The processing parameters are provided with reference to Table 2. For example, the pressure can range between about 0 milliTorr (mT) and about l0OmT with a preferred pressure of about 10 mT. The transformer coupled plasma (TCP) power is between about 800 watts (W) and about 1500 W. One skilled in the art will appreciate that the processing chamber may be configured as a capacitively coupled chamber or an inductively coupled chamber. For a capacitively coupled chamber the bottom power is preferably set to 0. The fluorine containing gas can be introduced at a flow rate of between about 0% and about 10% of the maximum flow rate of the oxygen containing gas. It will be apparent to one skilled in the art that while $SF_6$ is listed as the fluorine containing gas, other fluorine containing gases, such as $NH_3$ can be substituted. In one embodiment, the oxygen containing gas is introduced with an inert gas into the processing chamber. For example, the oxygen containing gas can be mixed with nitrogen, argon, helium, etc. In this embodiment, the inert gas flow rate is between about 0% and 20% of the maximum flow rate of the oxygen containing gas.

The method of FIG. 5 then proceeds to operation 176 where the WAC step for the removal of carbon based byproducts is performed. Here, the carbon clean step, as explained above, is executed with the process parameters set as described with reference to Table 2 or Table 3. In decision operation 178 it is determined if the carbon byproduct has been removed. In one embodiment, the endpoint is determined by optical emission spectroscopy (OES), such as through OES monitor 116 with reference to FIG. 2.

As the addition of a fluorine containing gas is optional during the carbon clean step, Table 3 lists the process parameters for a carbon clean step in which only an oxygen containing gas is used to create a plasma, in accordance with one embodiment of the invention. It should be appreciated that the ranges provided in Table 3 are substantially similar to the ranges provided in Table 2 above, except that Table 3 eliminates the fluorine containing gas.

TABLE 3

| Parameter | Optimal Range | Mid Range | Wide Range |
| --- | --- | --- | --- |
| Pressure | 10 mT | 10–40 mT | <100 mT |
| TCP Power | 1000 W | 800–1000 W | 800–1500 W |
| O2 Flow | 100 sccm | 100–500 sccm | 100–600 sccm |

It is preferred to perform the two step process with the silicon clean step performed first and the carbon clean step performed second. However, the order of the steps can be reversed. The amount of the fluorine containing gas in the carbon clean step is limited so that the oxygen containing gas can effectively prevent aluminum fluoride compounds from building up on the inner surfaces of the processing chamber from the carbon clean step. The one step WAC recipe leaves a deposit of aluminum fluoride on the chamber surface.

As discussed above, the endpoints for the silicon clean step and the carbon clean step can employ optical emission spectroscopy (OES) to monitor wavelengths specific to chamber deposition removal products and chamber deposition removal reactants. The specific wavelengths for fluorine containing compounds are 309 nm representative of $SiF_x$ species, 390 nm for $SiF_2$, and 680 nm or 703nm for reactant fluorine (chemical symbol F). An initial base line constitutes the wavelengths recorded from a clean chamber state and used as threshold or nominal values for OES intensity. The intensity of the specific wavelengths is noted for slope as a function of time. When intensity curves for the specific wavelengths shows a slope about equal to zero, it is indicative of no additional cleaning occurring and no change in the relative concentration of the reactant or product species.

In one embodiment, the WAC endpoint time for the silicon based byproduct is reached when the recommended wavelengths (390 rn, 309 nm or 680 nm or 703nm) produce the initial clean chamber intensities and intensity curve slope of zero with time. The specific wavelength monitored for oxygen containing compounds (such as carbon monoxide or CO) is 520 nm. Therefore, the WAC endpoint time for the carbon based compounds will be reached when the 520 nm wavelength produces the initial clean chamber intensities and intensity curve slope of about zero with time. In the case of carbon based compounds, the intensity slope is noted for oxygen containing compounds since the etchants are oxygen based. It should be appreciated that when fluorine containing compounds are included in the carbon clean, then all the above listed wavelengths can be monitored to determine an endpoint, as the OES is not restricted in the number of wavelengths that can be monitored.

Table 4 summarizes the two step WAC recipe in accordance with one embodiment of the invention. As mentioned above, the endpoint times for the silicon clean times and the carbon clean times can be determined based upon a signal for an OES monitor. The OES monitor is configured to detect the appropriate wavelengths and the signals are then compared to a baseline signal of a clean chamber state.

TABLE 4

| Step Number | 1 | 2 | 3A | 3B |
| --- | --- | --- | --- | --- |
| Step Type | Stability | Silicon Clean-1 | Carbon Clean-2 ($O_2$ only) | Carbon Clean-2 ($O_2$ + fluorine compound) |
| Pressure | 3 mT | 3 mT | 10 mT | 10 mT |
| TCP Power | 0 | 1000 W | 1000 W | 1000 W |
| Bias Voltage | 0 | 0 | 0 | 0 |
| $O_2$ | N/A | N/A | 100 sccm | 100 sccm |
| $SF_6$ | 50 sccm | 50 sccm | 10 sccm | 10 sccm |
| Inert gas | N/A | N/A | 20 sccm | N/A |
| Completion basis | Stable | Time | Time | Time |
| Time (sec) | 30 | 17 | 6 | 6 |

One skilled in the art will appreciate that the stability step conditions the environment inside the chamber so the environment is stable and consistent prior to starting the silicon clean step. As mentioned above the carbon clean step can be performed with an oxygen containing compound only or with an oxygen containing compound and a fluorine containing compound. Additionally, an inert gas can be introduced with an oxygen containing compound in step number 3A or 3B. Table 4 is shown for exemplary purposes only and not meant to be limiting. In addition to the process parameters varying between processing chamber designs, values for the parameters within the ranges provided in Tables 1–3 can also be substituted.

As shown by Table 4, the time allotted for the silicon clean step and the carbon clean step can be tailored to the type of process. That is, if the process deposits more silicon based byproducts on the chamber walls, then the silicon clean step is configured to remove the deposited by products without over-cleaning or under-cleaning. In turn, a more consistent environment is provided for substantially eliminating etch rate drift due to varying chamber conditioning. Since the silicon based deposition byproducts are more completely removed as compared to a composite recipe, there is no longer a surface area larger than the wafer for absorbing/desorbing reactant species during etching operations. Similarly, since the carbon based byproducts tend to be accumulated in a lesser amount than the silicon based byproducts, the time allotted for the carbon clean step can be reduced in order to efficiently clean the carbon based byproducts. Accordingly, the overall cleaning time as compared to the one step composite process is not significantly different. While Table 4 provides specific times for each step, each of the steps can be controlled through the detection of an endpoint by an OES monitor configured to detect certain wavelengths. Here, the OES monitor would detect the endpoint and output a signal to trigger the completion of the respective cleaning step.

Figure 6:
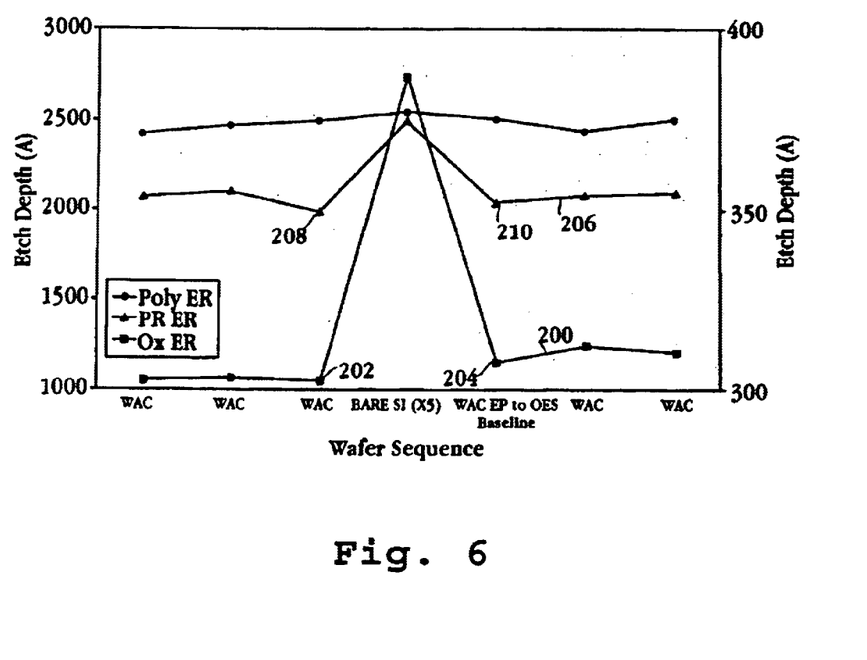
FIG. 6 is a graph depicting the effect of the WAC process on the etch rate performance in accordance with one embodiment of the invention.

FIG. 6 is a graph depicting the effect of the WAC process on the etch rate performance in accordance with one embodiment of the invention. It is known that initial etch rates are lower from a clean chamber until a sufficient number of conditioning wafers are employed to stabilize the etch rate which in turn slowly drifts over the course of the mean time between cleaning (MTBC) cycles. Line 200 represents an oxide etch rate where a WAC is performed at different time periods. A wafer-less auto clean is performed after each wafer up to point 202. Then, 5 bare silicon wafers are processed after point 202 without performing a WAC. As shown, there is approximately a 27% increase in the oxide etch rate on a pattern oxide wafers without a WAC vs. with a WAC after every wafer. That is, the wafer etched following the 5 bare wafers performed without a WAC, experiences a 27% increase in etch depth. It should be appreciated that at point 204, the WAC is resumed after every wafer.

Still referring to FIG. 6, the photoresist (PR) etch rate, represented by line 206, is similarly impacted when compared with and without WAC performed after every wafer being processed. That is, between point 208 and 210, where 5 bare silicon wafers are processed, there is approximately a 25% increase in the PR etch rate. Likewise, once the WAC are resumed at point 210 the etch rate stabilizes from wafer to wafer. Accordingly, performing the WAC after every cycle provides a constant starting point for each etch operation, thereby enabling minimal variation of the etch rate from wafer to wafer. It should be appreciated that the WAC allows for the repeatability of the etch rate, within a narrow range, for each successive etch operation.

Figure 7:
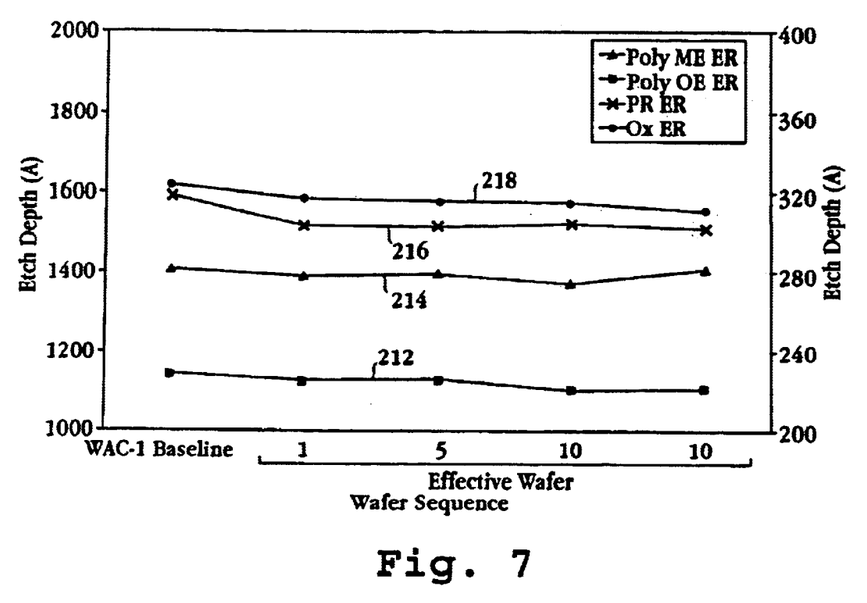
FIG. 7 is a graph of etch rate repeatability using a Polygate Release recipe where a WAC is performed after each wafer in accordance with one embodiment of the invention.

FIG. 7 is a graph of etch rate repeatability using a Polygate Release recipe where a WAC is performed after each wafer in accordance with one embodiment of the invention. Lines 212, 214, 216 and 218 represent poly main etch, poly over etch, oxide main etch and photoresist main etch, respectively. The etch rate repeatability and stability from the first wafer to the 25$^{th}$ wafer was measured when a WAC was performed initially and after each wafer was processed. The etch rate repeatability and stability over the 25 wafers with a WAC performed between each wafer was within 0.7% for the poly main etch, 2.6% for the poly over etch, 3.1% for the oxide main etch and 4.6% for the photoresist main etch. Accordingly, by providing a consistent environment from wafer to wafer, along with standardizing the starting conditions through the performance of a WAC that is designed for optimization of each of the silicon and carbon byproducts, tighter control over the etch rates is accomplished. In turn, the critical dimensions defined through the etching processes are controlled within suitable ranges.

Figure 8:
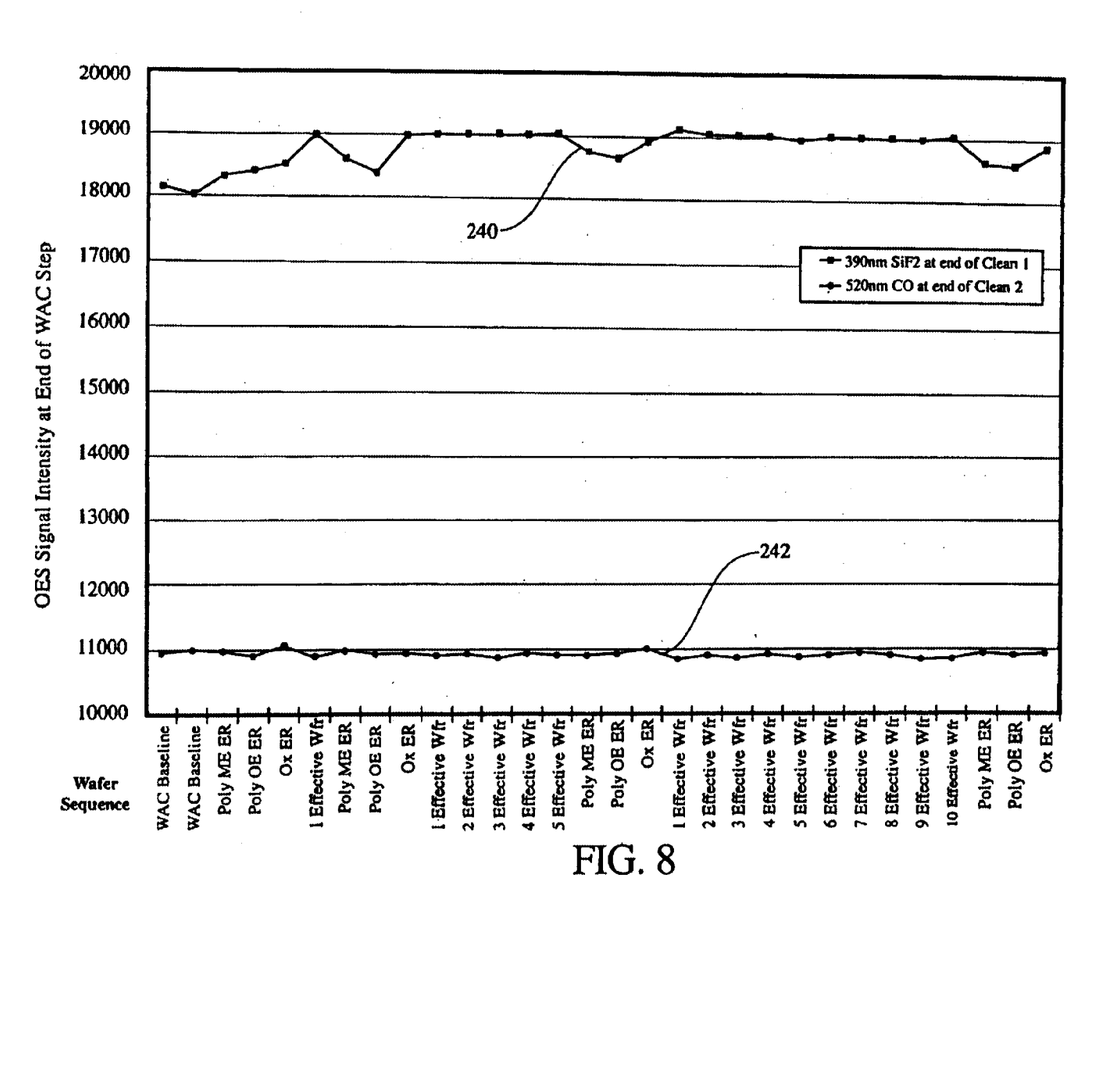
FIG. 8 is a graph displaying the repeatability of an OES signal intensity monitored at the end of a WAC step performed for a polygate release process in accordance with one embodiment of the invention.

FIG. 8 is a graph displaying the repeatability of an OES signal intensity monitored at the end of a WAC step performed for a polygate release process in accordance with one embodiment of the invention. Line 240 represents the signal intensity from monitoring the 390 nanometer (nm) wavelength at the end of a WAC step. The 390 nm wavelength measurement is indicative of an amount of $SiF_x$, which is a chamber deposition removal product. That is, in the silicon clean step, the plasma created from the fluorine containing gaseous mixture causes the silicon based byproduct to combine with fluorine reactant and is removed from the chamber as $SiF_x$. Line 242 represents the signal intensity from monitoring the 520 nm wavelength at the end of a WAC step. The 520 nm wavelength measurement is indicative of an amount of carbon monoxide (CO), which is a chamber deposition removal product. During the carbon clean step, the plasma created from the oxygen containing gaseous mixture causes the carbon based byproduct to combine with oxygen reactant and is removed from the chamber as CO.

Still referring to FIG. 8, it should be appreciated that the OES, such as the OES with reference to FIG. 2, is configured to monitor the 390 nm $SiF_2$ signal during the silicon removal step discussed above with reference to FIGS. 3 and 4. Of course, the OES can also be configured to monitor other wavelengths of interest during the silicon clean step, such as 309 nm which is representative of $SiF_x$ chamber deposition removal product (other than $SiF_2$), and 680 nm or 703 nm which is representative of fluorine chamber deposition removal reactants. Similarly, during the carbon clean step, the OES is configured to monitor the 520 nm which is indicative of carbon monoxide (CO), a chamber deposition removal product.

As will be explained in more detail in reference to FIGS. 9 and 10, the initial baseline OES intensity for each of the above mentioned wavelengths is recorded from an initial clean chamber state and used as threshold values for endpoint triggering. In one embodiment, once the slopes of the measured wavelengths are about zero, i.e., substantially no change, after reaching the threshold value, indicates an endpoint. FIG. 8 verifies that an initial clean chamber has a distinct OES signature that is reproducible after running the WAC. The wafer sequence on the x axis of FIG. 8, represents two initial baseline WAC values followed by processing steps after which a WAC is performed. An effective wafer is defined as a polygate main etch (ME) recipe on a photoresist/silicon donut wafer followed by a polygate recipe on a patterned oxide wafer. It should be appreciated that this sequence simulates the processing of a integrated wafer with polysilicon and oxide films. The main etch chemistries are run on a photoresist/silicon donut wafer followed by over-etch chemistries on an oxide wafer and thus, is defined as an effective wafer i.e., substitute for the integrated wafer. In one embodiment, the centerpoint 2300 PolyWAC recipe for the polygate release process is the WAC recipe. Here, the centerpoint 2300 PolyWAC recipe is the two step WAC discussed above with reference to FIGS. 3–5. During the silicon clean, the pressure is about 3 mTorr, the TCP power is about 1000 W, the flow rate of $SF_6$ is about 50 sccm, and the time for the silicon clean step is about 17 seconds. During the carbon clean, the pressure is about 10 mTorr, the TCP power is about 1000 W, flow rate of $O_2$ is about 100 sccm, the flow rate of the $SF_6$ is about 10 sccm, and the time for the carbon clean step is about 6 seconds.

It should be appreciated that FIG. 8 is provided for exemplary purposes only and is not meant to be limiting. For example, while the carbon clean step includes an optional fluorine containing gas ($SF_6$), the carbon clean step can be performed with oxygen only. The ranges for the process parameters can vary with in the ranges provided in Tables 1–3. The repeatability of the OES final intensity after each WAC as compared to initial WAC baseline values supports the effectiveness of the two step WAC in returning the processing chamber to an equivalent state after the processing of a wafer. Thus, the constant initial environment assists in maintaining consistent etch rates from wafer to wafer.

Figure 9:
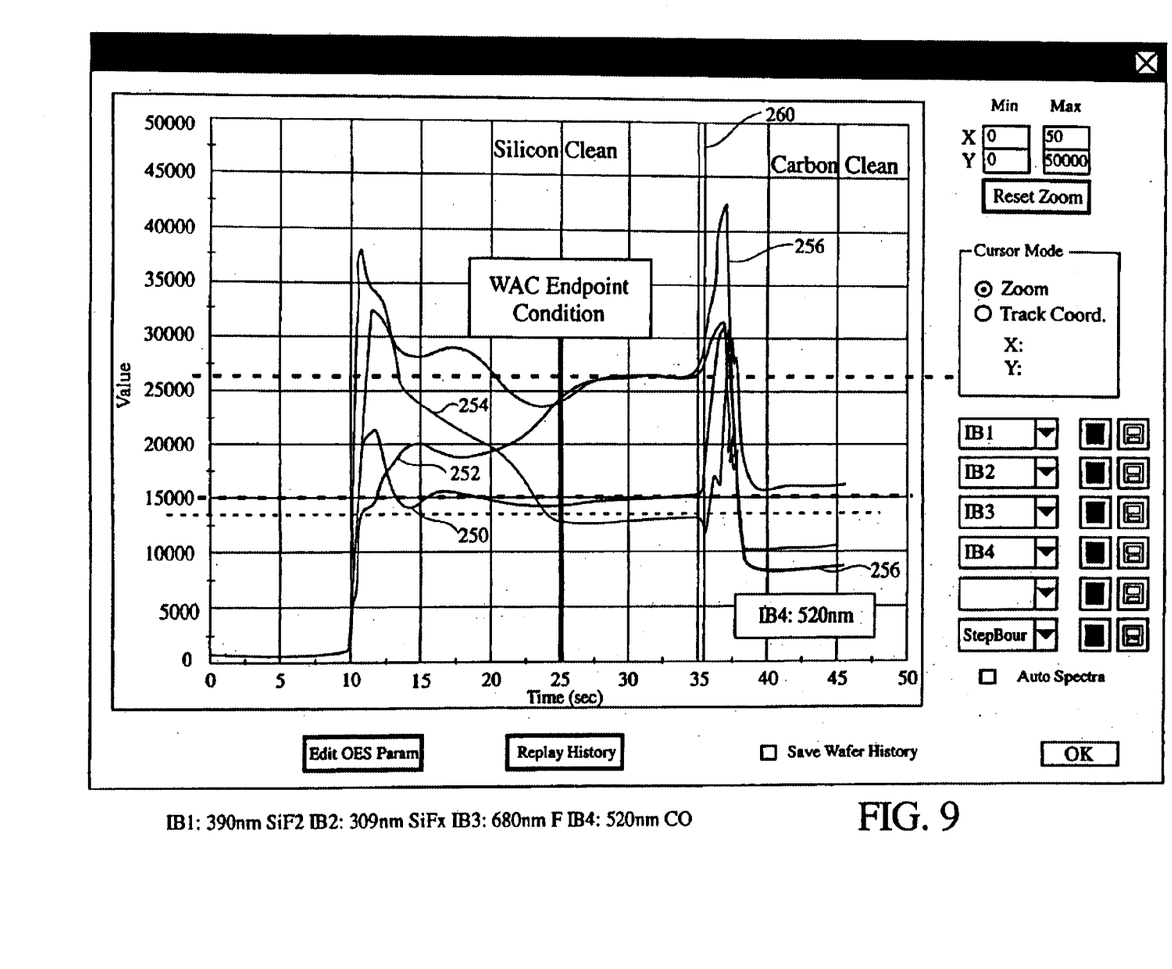
FIG. 9 is a graph of the time trace of the intensity of the signals from selected wavelengths to determine a WAC endpoint condition in accordance with one embodiment of the invention.

FIG. 9 is a graph of the time trace of the intensity of the signals from selected wavelengths to determine a WAC endpoint condition in accordance with one embodiment of the invention. Integration band (IB) 1 represented by line 250 is representative of the 390 nm signal that indicates an amount of $SiF_2$. Here, the signal shows a downward slope with an inflection point that may have multiple peaks and then reach the baseline initial clean chamber intensities when the slope approaches zero. IB 2 represented by line 254 is representative of the 309 nm signal that indicates an amount of $SiF_x$ species besides $SiF_2$. Similar to line 250, the 309 nm signal trace shows a downward slope that reaches the baseline initial clean chamber intensities when the slope approaches zero. It should be appreciated that the $SiF_2$ and the $SiF_x$ species are chamber deposition removal products. Thus, initially there is a large concentration of the silicon byproducts and the byproducts are removed from the chamber surfaces so that eventually the concentration decreases as the surfaces are cleaned. IB 3 represented by line 252 is representative of the 680 nm or 703 nm signal that indicates an amount of reactive fluorine. The reactive fluorine is a chamber deposition removal reactant. Thus, the 680 nm or 703 nm signal shows a rising signal with an inflection point that may have multiple plateaus and eventually reach a baseline initial clean chamber intensity when the slope approaches zero.

In one embodiment, the WAC endpoint for the silicon clean step is defined as the point where the above three wavelengths (309 nm, 390 nm, and 680 nm or 703 nm) meet the boundary conditions of the initial clean chamber intensity and the slope of the intensity trace approaches zero. It should be appreciated that the endpoint can be defined in numerous manners where one of the three wavelengths or any combination of the three wavelengths are used to determine an endpoint of the silicon clean step. As mentioned above, the WAC endpoint can be run in a time mode where after a certain time period the WAC step is terminated or the WAC endpoint can automatically terminate the WAC step through hardware and software configured to monitor and terminate the WAC step. Where the WAC is operated in time mode, a user defined time, such as 4–6 seconds, is added for a cleaning window margin in one embodiment. It should be appreciated that the time for each step is determined by the methods described herein to prevent an under-clean or over-clean situation. Furthermore, the silicon clean step will also remove some carbon based byproducts at a lower removal rate than the carbon clean step.

The carbon clean step is represented by the portion of the graph to the right of divider 260. IB 4, represented by line 256 is representative of the 520 nm signal that indicates an amount of reactive fluorine which is a chamber deposition removal reactant. The 520 nm signal trace shows a downward slope that reaches the baseline initial clean chamber intensities when the slope approaches zero. As illustrated by FIG. 9, the limiting byproduct deposition species is silicon based due to the length of time required for the WAC step to return the chamber to the initial baseline level.

It will be apparent to one skilled in the art that the OES recipe parameters must be set up to achieve the best resolution during the hardware start-up phase. Exemplary initial settings include charged coupled device (CCD) gain of 2; width of 5 nm; the filter is a finite impulse response (FIR); and the number of samples is 10. Of course, these settings should be optimized for OES resolution and set constant throughout the MTBC cycle for the WAC recipe. One skilled in the art will appreciate that the settings may vary depending on the processing chamber and the OES.

Figure 10:
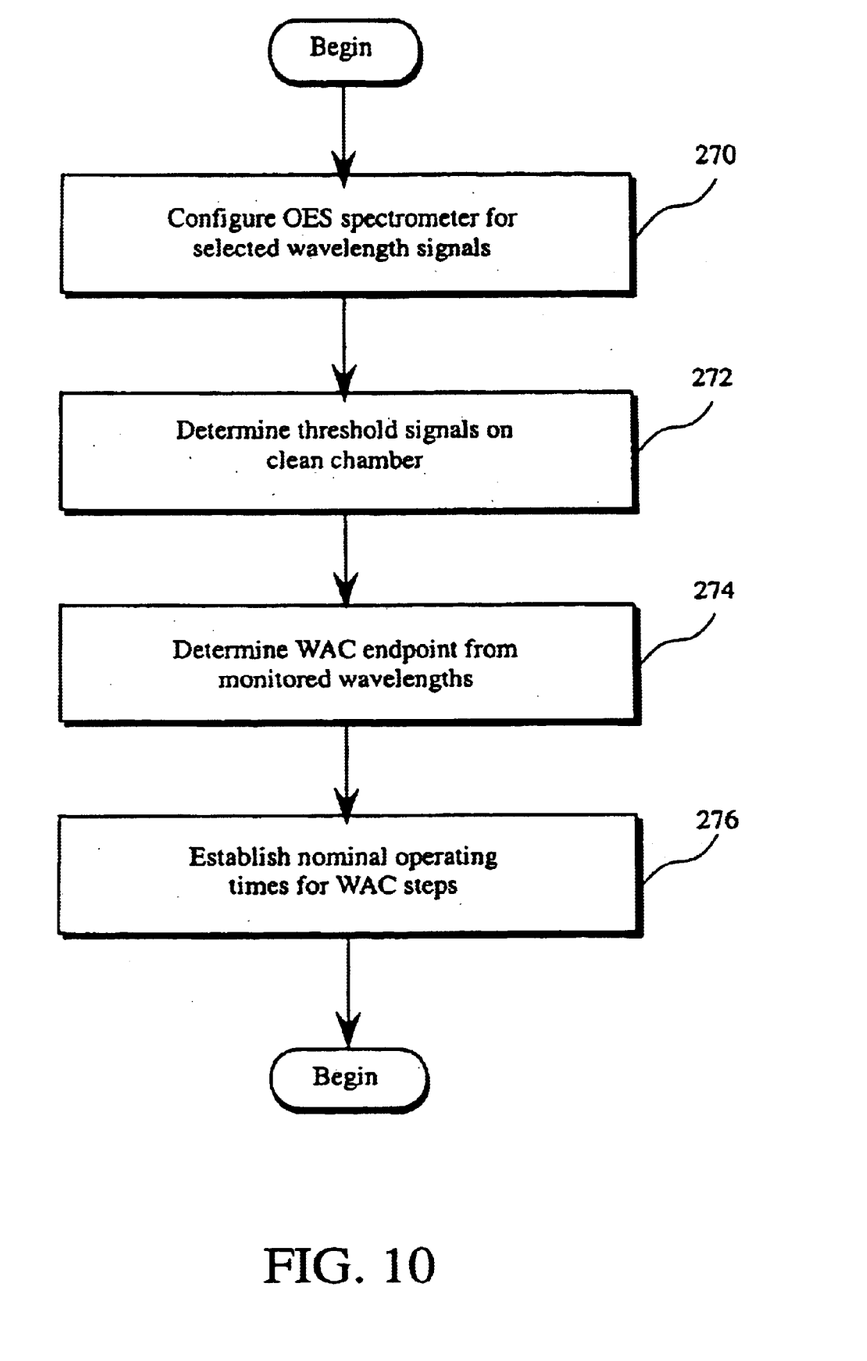
FIG. 10 is a flowchart diagram of the method operations involved in using and OES monitor to determine the WAC endpoint time in accordance with one embodiment of the invention.

FIG. 10 is a flowchart diagram of the method operations involved in using an OES monitor to determine the WAC endpoint time in accordance with one embodiment of the invention. The method initiates with operation 270 where the OES spectrometer is configured for the selected wavelength signals. For example, the OBS monitor can be set for optimal resolution of the integration band wavelength signals, such as the 309 nm, 390 nm, 520 run, and 680 nm or 703 nm wavelengths mentioned above for use with the two step WAC described herein. In addition, the initial settings for the OES monitor for the CD gain, width, filter and number of samples can be set as described above. The method then proceeds to operation 272 where the threshold signals at the selected wavelengths are determined for a clean chamber. In one embodiment, the centerpoint 2300 Poly WAC is run on a clean chamber with initial run times set as 17 seconds for the silicon clean step and 6 seconds set for the carbon clean step. The baseline threshold signal intensities for each of the selected wavelengths are recorded.

Still referring to FIG. 10, the method advances to operation 274 where the WAC OES endpoint is determined from the monitored wavelengths. Here, the equivalent process recipe is run on an equivalent wafer type and then followed by a WAC, such as the centerpoint Poly WAC. The endpoint time is determined for the silicon clean step when the integration band signals of FIG. 9 reach baseline OES threshold signal values and their respective slopes approach zero. The ending signal intensities are recorded for each selected wavelength. It should be appreciated that method operation 274 may repeated a number of times, such as 5, and the results averaged to arrive at a representative endpoint. Similarly, for the carbon clean step, the endpoint is determined when the integration band signals reach baseline OES threshold signal values and their respective slopes approach zero. As mentioned above, the endpoint may be based upon one integration band or a combination of integration bands.

The method of FIG. 10 then moves to operation 276 where the nominal endpoint operating times are established for the WAC steps. In one embodiment, the silicon clean step endpoint time is increased by a time period, such as between about 4–6 seconds, from the endpoint time determined in operation 274. The carbon clean step endpoint time is determined from the results of operation 276 and in one embodiment is set at about 6 seconds. One skilled in the art will appreciate that the centerpoint 2300 Poly WAC process can then be run in time mode from the above determined endpoint times for the silicon clean and carbon clean processes. Furthermore, the OES monitor data can be logged and presented to verify optimum performance. Thus, over-clean and under-clean situations arc avoided.

Alternatively, the endpoint can be controlled through the detected signal. That is, the OES monitor can interface with a control system configured to terminate the WAC step once a threshold value of the IB is obtained and the respective slope of a trace of the EB approaches zero. In one embodiment, the control system is integrated with the computer control system for the processing chamber such that the recipe will move to the next process once the WAC steps are completed. With the endpoint trigger feature intrinsic in the control software for the processing chamber, the user has the flexibility of processing mix applications with varying processing times, stacks, etc. resulting in varying amounts of byproduct deposition. Examples of such processing mix application include Polygate and Shallow Trench Isolation applications. Thus, the automated endpoint feature in the control software allows for the capability to run applications where the chamber deposition byproducts are deposited in differing amounts. The endpoint of the WAC process consistently returns the chamber to a constant clean starting condition. That is, the software coding adjusts the WAC endpoint times appropriately for different application products with different film stacks such that more dirty process applications will have longer WAC endpoint times and cleaner process applications have shorter WAC endpoint times. It should be appreciated that the WAC endpoint times can be used as a monitor for chamber clean effectiveness and chamber condition stability.

In summary, endpoint determnination for a two step cleaning process, such as the WAC described herein, uses optical emission spectroscopy to monitor the cleaning effectiveness of the cleaning process, to determine the appropriate time necessary for the cleaning process and to automatically endpoint the cleaning process. The endpoint determination allows for the user to run mix application products by providing at least one wavelength that is monitored to determine when a threshold value is obtained and a trace of the intensity of the value approaches a slope of zero. It should be appreciated that while the WAC is discussed with reference to two steps, more than two steps can be applied and the endpoint determined for each step as discussed herein. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed:

1. A method for determining an endpoint of an in-situ cleaning process of a semiconductor processing chamber, the method comprising:
   providing an optical emission spectrometer (OES) configured to monitor selected wavelength signals;
   determining baseline OES threshold signal intensities for each of the selected wavelength signals;
   determining an endpoint time of each step of the in-situ cleaning process, the determining an endpoint time including:
   executing a process recipe to process a semiconductor substrate within the processing chamber;
   executing the in-situ cleaning process for the semiconductor processing chamber by first removing a silicon based by-product from an inner surface of the chamber through a fluorine based plasma and upon completion of the removal of the silicon based by-product, removing a carbon based by-product from the inner surface of the chamber through an oxygen based plasma ; and
   recording the endpoint time for both the silicon based by-product removal step and the carbon based by-product removal step of the in-situ cleaning process; and
   establishing nominal operating times for each removal step of the in-situ cleaning process.

2. The method of claim 1, wherein the process recipe is an etch process.

3. The method of claim 1, wherein the method operation of executing the in-situ cleaning process further includes:
   flowing a fluorine based gaseous composition into the processing chamber to generate the fluorine based plasma; and
   flowing an oxygen based a second gaseous composition into the processing chamber to generate the oxygen based plasma.

4. The method of claim 1, further including:
   repeating the determining of the endpoint time of each step of the in-situ cleaning process for at least five times to result in at least five recorded endpoint times for each step of the in-situ cleaning process; and
   averaging each of the at least five recorded endpoint times of each step to arrive at an averaged endpoint time for each step of the in-situ cleaning process.

5. The method of claim 1, wherein the selected wavelength signals include at least one wavelength signal from the group consisting essentially of 390 nanometers (nm), 309 nm, 680 nm, 703 nm, and 520 nm.

6. The method of claim 5, wherein the 390 nm wavelength signal indicates an amount of $SiF_2$ chamber deposition removal products, the 309 nm wavelength signal indicates an amount of $SiF_x$ chamber deposition removal products, and the 520 nm wavelength signal indicates an amount of carbon monoxide (CO) chamber deposition removal products.

7. The method of claim 1, wherein the method operation of determining an endpoint time of each step of the in-situ cleaning process further includes:
   calculating a slope of a trace of a signal intensity of each of the selected wavelength signals.

8. The method of claim 7, further including:
   defining the endpoint time of each step when the slope of the trace of the signal intensity is about zero after reaching the baseline OES threshold intensity signal for each of the selected wavelength signals.

9. A method for cleaning byproducts deposited on interior surfaces of a semiconductor processing chamber, comprising: flowing an etchant process gas with a fluorine-containing compound being optimized to remove silicon and silicon compounds;
   forming a first plasma from the etchant process gas with the fluorine containing compound to perform a silicon based cleaning step;
   detecting an emission intensity of an optical radiation from a reactant product in the first plasma; and
   ending the silicon based cleaning step after the emission intensity reaches a threshold value and when a slope of a trace of the emission intensity is about zero;
   flowing an etchant process gas with an oxygen-containing compound, the oxygen-containing compound being optimized to remove carbon and carbon compounds;
   forming a second plasma from the etchant process gas with the oxygen containing compound to perform a carbon based cleaning step;
   detecting an emission intensity of an optical radiation from a product in the second plasma: and ending the carbon based cleaning step when a slope of a trace of the emission intensity is about zero after the emission intensity reaches a threshold value.

10. The method of claim 9, wherein the reactant is fluorine.

11. The method of claim 9, wherein the optical radiation has a wavelength selected from one of about 309 nanometers (nm), and about 390 nm.

12. The method of claim 9, wherein the method operation of detecting an emission intensity of an optical radiation from one of a reactant in the first plasma further includes:

providing an optical emission spectrometer (OES); and configuring OES parameters for optimal resolution of the emission intensity of the optical radiation from one of the reactant.

13. The method of claim 12, wherein the OES parameters are selected from the group consisting of charged couple device gain, width, filter type and number of samples.

14. The method of claim 9, wherein the product is carbon monoxide.

15. The method of claim 9, wherein the method operation of detecting an emission intensity of an optical radiation from a product in the first plasma further includes:

providing an optical emission spectrometer (OES); and configuring OES parameters for optimal resolution of the emission intensity of the optical radiation from the product.

* * * * *